(12) United States Patent
Pauletti et al.

(10) Patent No.: US 9,812,439 B2
(45) Date of Patent: Nov. 7, 2017

(54) BI-DIRECTIONAL ESD PROTECTION CIRCUIT

(71) Applicant: Texas Instruments Incorporated, Dallas, TX (US)

(72) Inventors: Timothy Patrick Pauletti, Plano, TX (US); Sameer Pendharkar, Dallas, TX (US); Wayne Tien-Feng Chen, Plano, TX (US); Jonathan Brodsky, Richardson, TX (US); Robert Steinhoff, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 388 days.

(21) Appl. No.: 14/514,066

(22) Filed: Oct. 14, 2014

(65) Prior Publication Data

US 2015/0103451 A1   Apr. 16, 2015

Related U.S. Application Data

(62) Division of application No. 10/926,916, filed on Aug. 26, 2004, now Pat. No. 8,890,248.

(51) Int. Cl.
| | |
|---|---|
| *H02H 9/04* | (2006.01) |
| *H01L 27/02* | (2006.01) |
| *H01L 29/74* | (2006.01) |
| *H01L 29/87* | (2006.01) |
| *H01L 29/749* | (2006.01) |

(52) U.S. Cl.
CPC ...... *H01L 27/0262* (2013.01); *H01L 29/7436* (2013.01); *H01L 29/87* (2013.01); *H01L 29/749* (2013.01); *H01L 2924/0002* (2013.01)

(58) Field of Classification Search
CPC ............. H02H 9/04; H02H 9/041; H92H 9/04
USPC .......................................................... 361/56
See application file for complete search history.

(56) References Cited

U.S. PATENT DOCUMENTS

| | | |
|---|---|---|
| 4,199,774 A | 4/1980 | Plummer |
| 4,947,226 A | 8/1990 | Huang et al. |
| 5,631,793 A | 5/1997 | Ker et al. |

(Continued)

FOREIGN PATENT DOCUMENTS

WO    WO8302852    8/1983

OTHER PUBLICATIONS

European Search Report, Application No. 05791784.1, dated Jun. 16, 2010.

(Continued)

*Primary Examiner* — Dharti Patel
(74) *Attorney, Agent, or Firm* — William B. Kempler; Charles A. Brill; Frank D. Cimino

(57) ABSTRACT

An electrostatic discharge (ESD) device for protecting an input/output terminal of a circuit, the device comprising a first transistor with an integrated silicon-controlled rectifier (SCR) coupled between the input/output (I/O) terminal of the circuit and a node and a second transistor with an integrated silicon-controlled rectifier coupled between the node and a negative terminal of a supply voltage, wherein the silicon-controlled rectifier of the first transistor triggers in response to a negative ESD voltage and the silicon-controlled rectifier of the second transistor triggers in response to a positive ESD voltage.

19 Claims, 4 Drawing Sheets

(56) References Cited

U.S. PATENT DOCUMENTS

| | | | |
|---|---|---|---|
| 5,754,381 A | * | 5/1998 | Ker .................... H01L 27/0262 |
| | | | 361/56 |
| 6,137,140 A | | 10/2000 | Efland et al. |
| 6,144,070 A | | 11/2000 | Devore et al. |
| 6,344,960 B1 | | 2/2002 | Seo et al. |
| 6,444,511 B1 | | 9/2002 | Wu et al. |
| 6,614,077 B2 | | 9/2003 | Nakamura et al. |
| 6,690,555 B1 | | 2/2004 | Pasqualini |
| 2003/0214773 A1 | | 11/2003 | Kitagawa |

OTHER PUBLICATIONS

Shuming Xu, Rainer Constapel, Jacek Korec and Dieter Silbert, Bilbrt Bidirectional Lateral Base Resistance Controlled Thyristor, IEEE International Symposium on Power Semiconductor Devices and IC's, Weimar, Germany, May 26-29, 1997, pp. 281-284 () (Se the whole document).

Sameer Pendharkar, et al., "SCR-LDMOS—A Novel LDMOS Device With ESD Robustness," 2000 IEEE, pp. 341-344.

Jian-Hsing Lee, et al., "Novel ESD Protection Structure With Embedeed SCR LDMOS for Smart Power Technology," 2002 IEEE, pp. 156-161.

* cited by examiner

BI-DIRECTIONAL ESD PROTECTION CIRCUIT

CROSS-REFERENCE TO RELATED APPLICATIONS

This application is a divisional of U.S. patent application Ser. No. 10/926,916, filed Aug. 26, 2004 (now U.S. Pat. No. 8,890,248), which is hereby incorporated by reference for all purposes.

TECHNICAL FIELD

This invention relates to integrated circuits, and more specifically relates to bi-directional electrostatic discharge (ESD) protection circuits.

BACKGROUND

As semiconductor technology has constantly been improving, the use of field effect transistors (FETs) has become more prevalent in all facets of computer and communications technology. This technological improvement has allowed for faster operation and more compact arrangement of FETs within integrated circuit (IC) chips. IC chips are widely used in all electronic equipment, including equipment that is manufactured and operated in harsh environments. However, such harsh environments increase the likelihood of exposure of IC chips to high-voltage electrostatic discharge (ESD) strikes, to which IC chips are highly vulnerable. The high current that results from ESD strikes breaks down the internal semiconductor material of the FETs, resulting in damage to the IC chip. The vulnerability of IC chips to ESD strikes has created an important need for ESD protection circuits.

It is known in the art to use a silicon-controlled rectifier (SCR) circuit to protect an IC chip from ESD strikes. A SCR circuit utilizes two bipolar junction transistors (BJTs), one NPN type and one PNP type, coupled together. The two BJTs are operative, upon being triggered by an ESD strike, to shunt current resulting from the ESD strike (e.g., to ground), thus creating a path away from the more delicate semiconductor material and saving the FET, and thus the IC chip, from damage. SCR circuits are now commonly used in many electronic devices for this ESD protective purpose. However, SCR circuits are bulky and are typically configured external to the IC chip that they are intended to protect.

SUMMARY

One aspect of the present invention relates to an electrostatic discharge device for protecting an input or output terminal of a circuit. The device comprises two transistors, each with an integral silicon-controlled rectifier (SCR). The first transistor is coupled between an input/output (I/O) terminal of the circuit and a node. The second transistor is coupled between the node and the negative terminal of the supply voltage (e.g., ground). The transistors are situated opposite one another, such that their drain terminals share a common node.

When a positive electrostatic discharge (ESD) strike occurs, the first transistor acts as a diode coupled transistor, passing current from its source to its drain through a forward biased integral body diode. The voltage of the common drain node will increase relative to the source of the second transistor until it reaches a level sufficient to trigger the integral SCR of the second transistor. The integral SCR of the second transistor will then clamp the voltage, allowing the current to pass through the second transistor to the negative voltage supply terminal, thus mitigating ESD damage.

When a negative ESD strike occurs, the second transistor acts as a diode coupled transistor, passing current from its source to its drain through a forward biased integral body diode. The voltage of the common drain node will increase relative to the source of the first transistor until it reaches a level sufficient to trigger the integral SCR of the first transistor. The integral SCR of the first transistor will then clamp the voltage, allowing the current to pass through the first transistor to the I/O terminal, thus mitigating ESD damage.

Another aspect of the present invention relates to a communication system having integral ESD protection. Similar to the first aspect described above, this aspect comprises at least one transistor having an integral SCR. The transistor is configured as a communication driver, and the circuit further comprises a buffer that receives a communication signal that is provided to the gate of the communication driver transistor. The circuit provides positive ESD strike protection in the same manner as described above. Further, it can be appreciated that, with the addition of another transistor configured with its drain sharing a node with the drain of the communication driver transistor, the circuit will also provide negative ESD strike protection.

DETAILED DESCRIPTION

The present invention relates to an ESD device (e.g., a circuit) that is capable of bi-directional electrostatic discharge (ESD) strike protection. The ESD device comprises at least one transistor with an integral silicon-controlled rectifier (SCR). In one embodiment, the ESD device comprises two such transistors, each acting as diode coupled transistors, such that each contains an integral body diode capable of forward and reverse bias. When the circuit experiences an ESD event, one of the transistors will pass current through a forward bias of one of the transistors while the other triggers the integral SCR to clamp the high ESD voltage, thus shunting the current and protecting the circuit.

By employing two oppositely opposed transistors, the circuit can act bi-directionally, such that it will protect the circuit from both a positive and a negative ESD strike.

In one embodiment of the present invention, the ESD device employs laterally-diffused-metal-oxide-semiconductor-field-effect transistors (LDMOSFET). It can be appreciated, however, that any suitable transistor with an integral SCR can be used to construct the present invention. Parasitic bipolar transistors are inherent in the design of certain LDMOS transistors due to the combination and arrangement of differently doped P-type and N-type semiconductor wells. By arranging these wells in a certain way, the parasitic bipolar transistors can be formed in such a way as to create an integral SCR within the structure of the transistor. In addition, due to the arrangement of the P-type and N-type wells, PN junctions that act as parasitic body and substrate diodes are formed within the integral structure of the LDMOS transistor. From the foregoing description, it can thus be appreciated that, when arranged on a common substrate, LDMOS transistors can be situated so as to provide ESD protection within an integrated circuit (IC).

Figure 1:
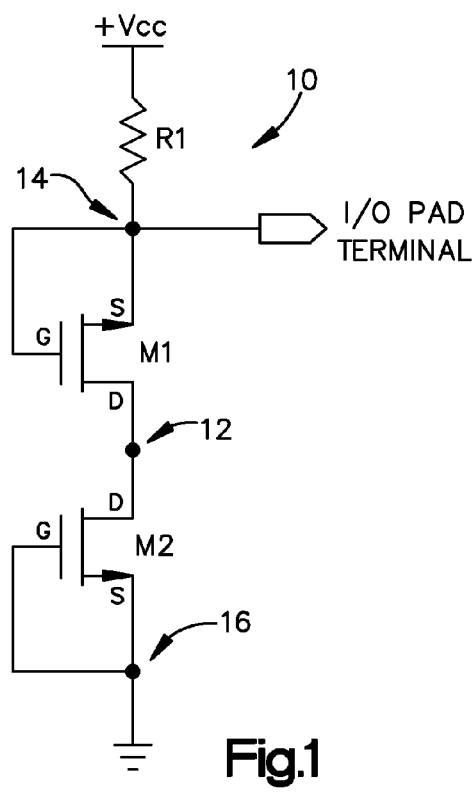
FIG. 1 illustrates a schematic diagram of an electrostatic discharge (ESD) protection device in accordance with an aspect of the invention.

FIG. 1 illustrates a dual diode configured DMOS structure 10 for bi-directional ESD strike protection, in accordance with an aspect of the invention. FIG. 1 shows two N-type DMOS transistors, M1 and M2, situated opposite one another such that the drain terminals of each transistor share a common node 12. It should be noted that, in this particular configuration, the gate terminal of transistor M1 has been shorted to the source terminal of transistor M1, and the gate terminal of transistor M2 has been shorted to the source terminal of transistor M2. The result of the source/gate terminal short circuits is that the DMOS transistors will never operate in a normal bias condition (e.g., the transistor will always operate in the cutoff region). The common source/gate terminal of transistor M1 shares a node 14 with the input/output (I/O) pad terminal, and the common source/gate terminal of transistor M2 shares a node 16 with the negative supply voltage, shown in FIG. 1 as ground. The circuit also contains a pull-up resistor R1 that separates the circuit from a positive voltage power supply $V_{cc}$.

When a positive ESD event occurs at the I/O Pad Terminal, the source/gate terminal of transistor M1 at node 14 is subjected to the high potential of the ESD strike relative to the common drain terminal 12. Transistor M1 responds by passing current from its source to the drain node 12 through a forward biasing action of its integral body diode (not shown). As the current flows into the common drain node 12 of transistors M1 and M2, the voltage at the common drain node 12 increases. When the voltage at node 12 increases to a critical point relative to the negative voltage source at node 16, at a voltage of perhaps 50 volts or greater, the integral SCR (not shown) of transistor M2 triggers. Upon triggering of the integral SCR of transistor M2, a current path through transistor M2 is created, thus clamping the voltage at common drain node 12 and shunting the current to the negative voltage source, shown as ground in FIG. 1. By clamping the voltage resulting from the positive ESD event, and shunting the resultant current, the circuit of FIG. 1 can be used to protect other associated circuitry from damage caused by the positive ESD event.

When a negative ESD event occurs at the I/O Pad Terminal, the source/gate terminal of transistor M1 at node 14 is subjected to the negative potential of the ESD strike relative to the negative voltage source. Transistor M2 responds by passing current from its source at the negative supply voltage, shown as grounded in FIG. 1, to the common drain node 12 through a forward biasing action of its integral body diode (not shown). In addition, transistor M1 will also pass current from the negative voltage source to the common drain node 12 by a forward bias action of an integral substrate diode (not shown). As the current flows into the common drain node 12 of transistors M1 and M2, the voltage at the common drain node 12 increases. When the voltage at node 14 becomes sufficiently negative relative to the common drain node 12, at a voltage of perhaps −50 volts or less, the integral SCR (not shown) of transistor M1 triggers. Upon triggering of the integral SCR of transistor M1, a current path through transistor M1 is created, thus clamping the negative voltage at common drain node 12 and shunting the current to the I/O Pad Terminal. By clamping the voltage resulting from the negative ESD event, and shunting the resultant current, the circuit of FIG. 1 can be used to protect other associated circuitry from damage caused by the negative ESD event. Therefore, the circuit of FIG. 1 provides bi-directional ESD protection.

Figure 2:
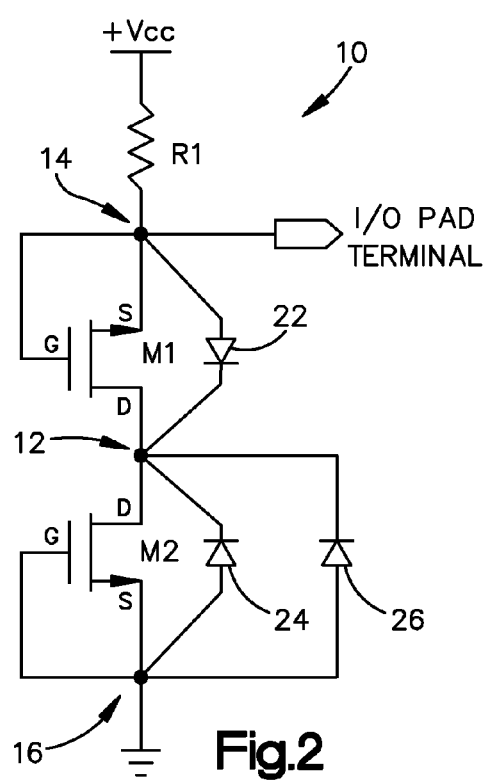
FIG. 2 illustrates a schematic diagram that depicts parasitic diodes associated with an ESD protection device in accordance with an aspect of the invention.

FIG. 2 illustrates the circuit of FIG. 1 and further incorporates the parasitic diodes, thus displaying the current paths through the diodes as discussed in the above described operation of the ESD protective circuit. Diode 22 as shown in FIG. 2 is the parasitic body diode of transistor M1, and is arranged with its anode connected to node 14 and its cathode connected to node 12. Diode 24 is the parasitic body diode of transistor M2, and is arranged with its anode connected to node 16 and its cathode connected to node 12. Diode 26 is the parasitic substrate diode of transistor M1, and is arranged parallel with the body diode 24 of transistor M2 with its anode connected to node 16 and its cathode connected to node 12.

Figure 3:
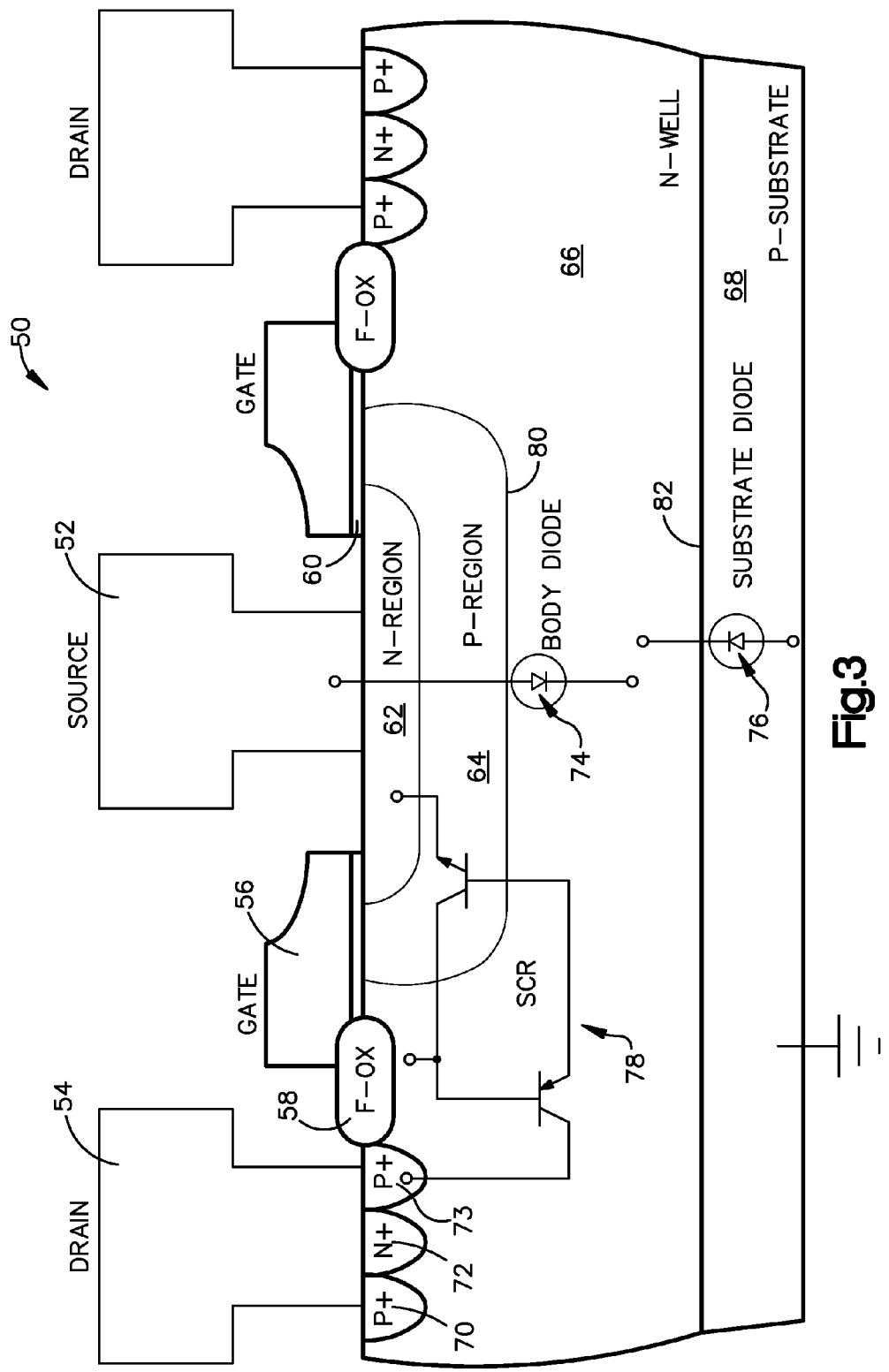
FIG. 3 illustrates a cross-sectional view of a laterally diffused metal oxide semi-conductor field effect transistor (LDMOSFET) with an integrated silicon-controlled rectifier (SCR) in accordance with an aspect of the invention.

FIG. 3 shows a cross-sectional view of a generally racetrack-shaped (as indicated by the symmetry about the source terminal 52) N-type LDMOS transistor 50 in accordance with an aspect of the invention. It should be appreciated that, although this embodiment details the present invention using a generally oval-shaped N-type LDMOS transistor, any type of suitable transistor known in the art and capable of achieving the desired parasitic effects would suffice. FIG. 3 details the configuration of the particular semiconductor P-type and N-type doped regions that create the integral parasitic diodes and SCR that achieve the integral ESD protection of the present invention.

The LDMOS transistor 50 of FIG. 3 comprises a source terminal 52, a drain terminal 54, and a gate terminal 56. The transistor may also contain one or more field-oxide regions 58 dividing the respective terminals, and the gate terminal 56 may be separated from the doped regions by an oxide layer 60. Beneath the drain terminal 54, the transistor 50 further comprises at least one each of a P+ anode 73 and an N+ anode 72. The configuration depicted in FIG. 3 contains an additional P+ anode 70. The doped regions beneath the anodes and other transistor terminals may comprise a number of layers, including N-region 62 and P-region 64, which are conductively coupled to the source terminal 52, and the N-well 66, which is conductively coupled to the drain terminal 54. At the bottom of the transistor 50 is the P-substrate 68, which may be grounded as demonstrated in FIG. 3.

The junctions of the doped regions as shown in the LDMOS transistor 50 of FIG. 3 are what enable the parasitic effects of the transistor. These parasitic effects are what create a body diode 74, a substrate diode 76, and a SCR 78. Body diode 74 is formed by the PN junction 80, with an anode at P-region 64 and a cathode at N-well 66. Likewise, substrate diode 76 is formed by the PN junction 82, with an anode at P-substrate 68 and a cathode at N-well 66. The integral SCR 78 is formed from the PNPN junction of P+ anode 73, N-well 66, P-region 64, and N-region 62. Integral SCR 78 is shown in FIG. 3 as an electrically coupled pair of bipolar junction transistors (BJTs) superimposed on the body of the LDMOS transistor 50 with its electrical terminals located to form a SCR.

Referring back to FIG. 2, when a positive ESD event occurs at the I/O Pad Terminal, the source/gate terminal of transistor M1 at node 14 is subjected to the high potential of the ESD strike relative to the common drain terminal 12. Transistor M1 responds by passing current through the forward biasing of parasitic body diode 22. It should be appreciated that body diode 24 of transistor M2 may also reverse bias in response to the positive ESD event. As the current flows into the common drain node 12 of transistors M1 and M2, the voltage at the common drain node 12 increases. When the voltage at node 12 increases to a critical point relative to the negative voltage source at node 16, at a voltage of perhaps 50 volts or greater, the integral SCR (not shown) of transistor M2 triggers. Upon triggering of the integral SCR of transistor M2, a current path through transistor M2 is created, thus clamping the voltage at common drain node 12 and shunting the current to the negative voltage source, shown as ground in FIG. 2.

When a negative ESD event occurs at the I/O Pad Terminal, the source/gate terminal of transistor M1 at node 14 is subjected to the negative potential of the ESD strike relative to the negative voltage source. Transistor M2 responds by passing current from the negative voltage source, shown as grounded in FIG. 1, through the forward biasing of parasitic body diode 24. In addition, transistor M1 will also pass current from the negative voltage source through the forward biasing of parasitic substrate diode 26. It should be appreciated that body diode 22 of transistor M1 may also reverse bias in response to the negative ESD event. As the current flows into the common drain node 12 of transistors M1 and M2, the voltage at the common drain node 12 increases. When the voltage at node 14 becomes sufficiently negative relative to the common drain node 12, at a voltage of perhaps −50 volts or less, the integral SCR (not shown) of transistor M1 triggers. Upon triggering of the integral SCR of transistor M1, a current path through transistor M1 is created, thus clamping the negative voltage at common drain node 12 and shunting the current to the I/O Pad Terminal.

Figure 4:
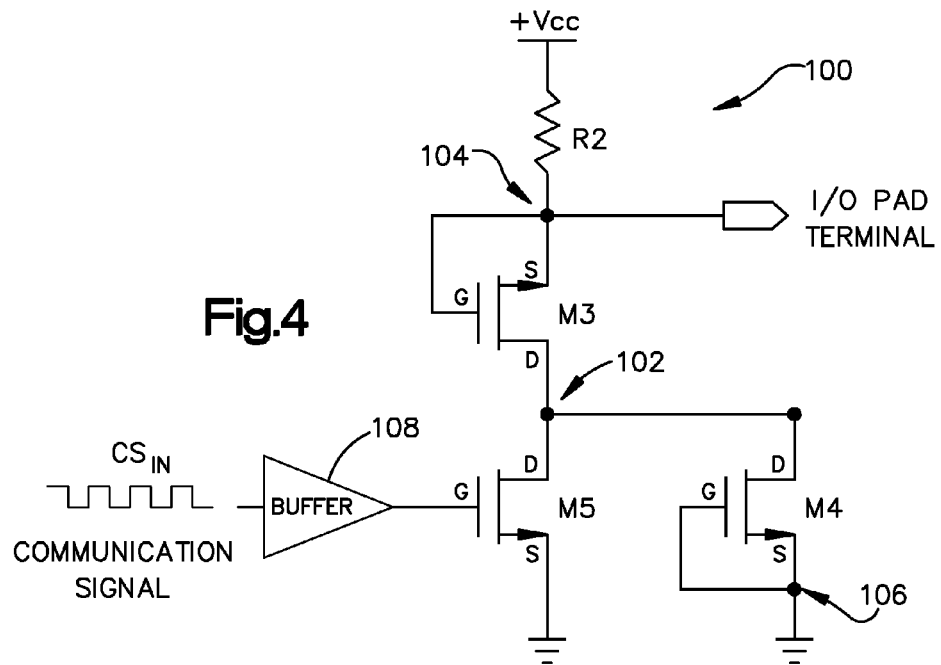
FIG. 4 illustrates a schematic diagram of a communication system with bi-directional ESD protection in accordance with an aspect of the invention.

FIG. 4 illustrates a communication driver circuit 100 with bi-directional ESD protection in accordance with another aspect of the present invention. FIG. 4 shows three N-type DMOS transistors, M3, M4, and M5, with M3 situated opposite M4 and M5 such that the drain terminals of each transistor share a common node 102. It should be noted that, in this configuration, the gate terminals of transistors M3 and M4 have been shorted to their respective source terminals. The result of the source/gate terminal short circuits is that transistors M3 and M4 will never operate in a normal bias condition (e.g., the transistor will always operate in the cutoff region). The common source/gate terminal of transistor M3 shares a node 104 with the input/output (I/O) pad terminal, and the common source/gate terminal of transistor M4 shares a node 106 with the negative supply voltage, shown in FIG. 4 as ground. The circuit also contains a pull-up resistor R2 that separates the circuit from the positive voltage power supply $V_{cc}$. It should be noted that, during normal operation of the communication driver circuit 100, transistor M3 acts as a diode to prevent current flow from the negative supply voltage to the I/O pad terminal in the event that the I/O pad terminal voltage becomes negative with respect to the negative supply voltage.

Communication driver transistor M5, which could be a low side driver, has a drain terminal connected to common drain node 102, and a source terminal connected to the negative power supply, shown as ground in FIG. 4. It should be appreciated that, although communication driver transistor M5 is shown in FIG. 4 as an N-type DMOS transistor, any type of communication driver transistor known in the art will suffice. The communication driver circuit 100 further includes a communication buffer 108 that receives a communication signal $CS_{in}$, which is output from communication buffer 108 to the gate terminal of communication driver transistor M5.

As illustrated in FIG. 4, communication driver circuit 100 contains functional communication circuitry using communication driver transistor M5 while still maintaining the same level of bi-directional ESD protection, as discussed above with regard to FIG. 1, from DMOS transistors M3 and M4. It should be appreciated that the communication driver circuit 100 could be used in any application that requires ESD protection on a communication driver circuit, even in higher voltage applications such as an automotive bus.

Figure 5:
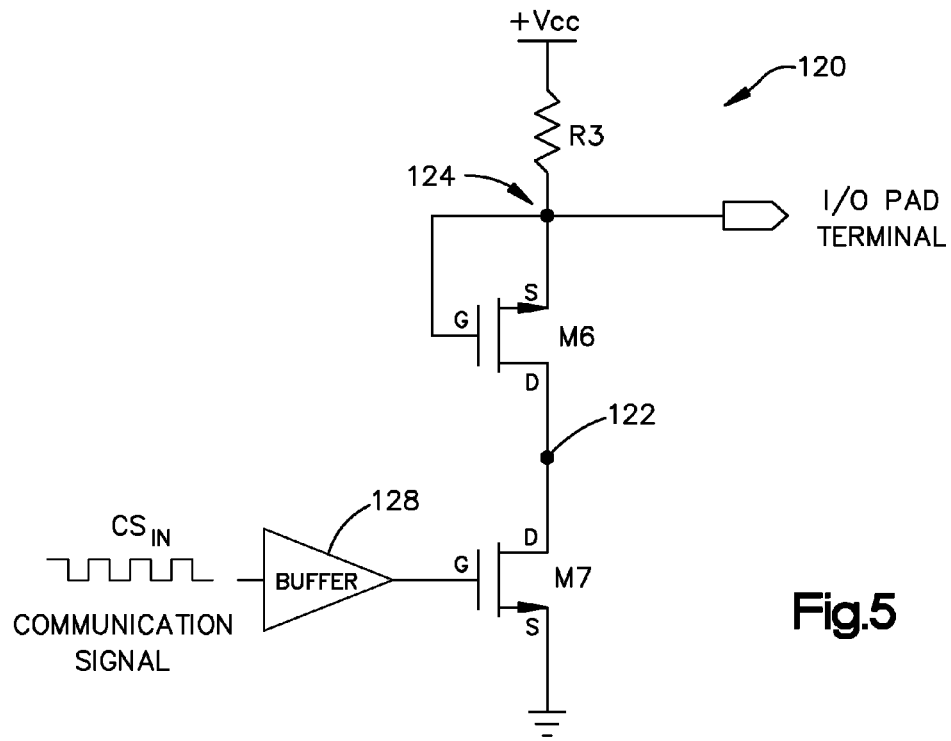
FIG. 5 illustrates a schematic diagram of another communication system with bi-directional ESD protection in accordance with an aspect of the invention.

FIG. 5 illustrates another communication driver circuit 120 with bi-directional ESD protection including an integral SCR as part of the communication driver transistor in accordance with an aspect of the present invention. FIG. 5 shows two N-type DMOS transistors, M6 and M7 situated opposite each other such that the drain terminals of each transistor share a common node 122. It should be noted that, in this configuration, the gate terminal of transistor M6 has been shorted to its respective source terminals. The result of the source/gate terminal short circuit is that transistor M6 will never operate in a normal bias condition (e.g., the transistor will always operate in the cutoff region). The common source/gate terminal of transistor M6 shares a node 124 with the input/output (I/O) pad terminal. The circuit also contains a pull-up resistor R3 that separates the circuit from the positive voltage power supply $V_{cc}$. It should be noted that, during normal operation of the communication driver circuit 120, transistor M6 acts as a diode to prevent current flow from the negative supply voltage to the I/O pad terminal in the event that the I/O pad terminal voltage becomes negative with respect to the negative supply voltage.

Communication driver transistor M7, which could be a low side driver, has a drain terminal connected to common drain node 122, and a source terminal connected to the negative power supply, shown as ground in FIG. 5. It should be appreciated that, although communication driver transistor M7 is shown in FIG. 5 as an N-type DMOS transistor, any type of communication driver transistor known in the art that is capable of achieving the desired parasitic effects will suffice. The communication driver circuit 120 further includes a communication buffer 128 that receives a communication signal CSin, which is output from communication buffer 128 to the gate terminal of communication driver transistor M7.

As illustrated in FIG. 5, communication driver circuit 120 contains functional communication circuitry using communication driver transistor M7 while still maintaining the same level of bi-directional ESD protection, as discussed above with regard to FIG. 1, from DMOS transistors M6 and M7. In effect, this means that communication driver M7 is operable as a communication driver transistor as well as a transistor with an integral parasitic body diode (not shown), parasitic substrate diode (not shown), and SCR (not shown)

capable of providing bi-directional ESD protection in combination with DMOS transistor M6. It should be appreciated that the communication driver circuit 120 could be used in any application that requires ESD protection on a communication driver circuit, even in higher voltage applications such as an automotive bus.

Figure 6:
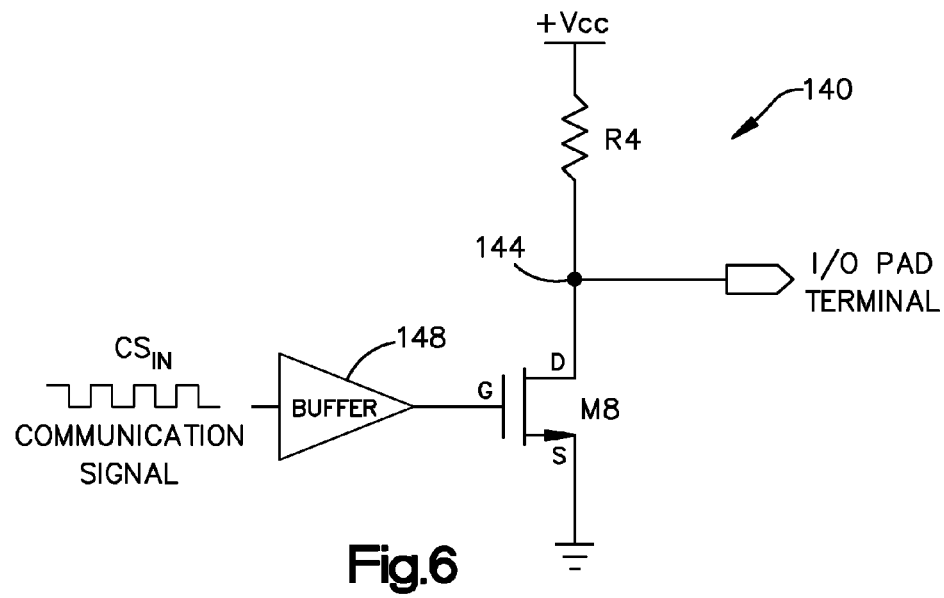
FIG. 6 illustrates a schematic diagram of a communication driver device with ESD protection for positive ESD voltages in accordance with an aspect of the invention.

FIG. 6 illustrates another communication driver circuit 140 with positive ESD protection including an integral SCR as part of the communication driver transistor in accordance with an aspect of the present invention. Communication driver transistor M8, which could be a low side driver, has a drain terminal connected to node 144, which is shared by the I/O Pad Terminal, and a source terminal connected to the negative power supply, shown as ground in FIG. 6. It should be appreciated that, although communication driver transistor M8 is shown in FIG. 6 as an N-type DMOS transistor, any type of communication driver transistor known in the art that is capable of achieving the desired parasitic effects will suffice. The communication driver circuit 140 further includes a communication buffer 148 that receives a communication signal CSin, which is output from communication buffer 148 to the gate terminal of communication driver transistor M8.

As illustrated in FIG. 6, communication driver circuit 140 contains functional communication circuitry using communication driver transistor M8 while still maintaining positive ESD protection, as discussed above with regard to a positive ESD strike in FIG. 1, from DMOS transistor M8. In effect, this means that communication driver M8 is operable as a communication driver transistor as well as a transistor with an integral parasitic body diode (not shown) and a SCR (not shown) capable of providing positive ESD protection. It should be appreciated that the communication driver circuit 140 could be used in any application that requires ESD protection on a communication driver circuit, even in higher voltage applications such as an automotive bus.

Figure 7:
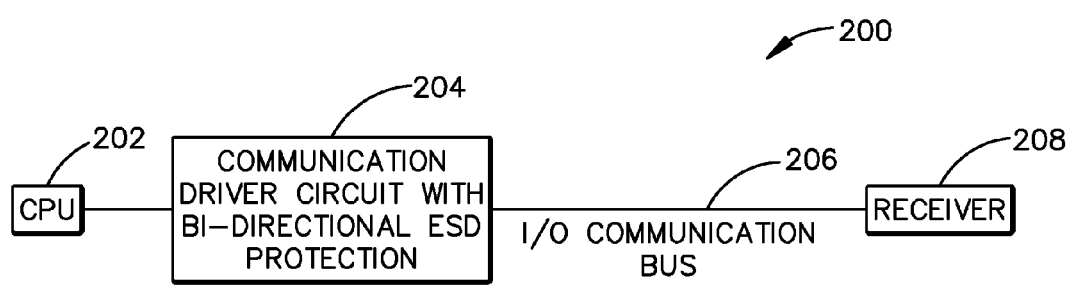
FIG. 7 illustrates a communication system with a communication driver circuit with bi-directional ESD protection in accordance with an aspect of the invention.

FIG. 7 illustrates a communication system 200 utilizing the communication driver circuit with bi-directional ESD protection in accordance with an aspect of the invention. The communication system 200 comprises a CPU 202 that provides a communication signal. The communication signal is sent to the communication driver circuit with bi-directional ESD protection 204. This circuit could be a circuit as illustrated in FIG. 4 or FIG. 5. The communication driver circuit then transmits the communication signal across the I/O communication bus 206 to a receiver 208. The signal is then processed at the receiver 208. The communication system 200 of FIG. 7 could be used in a variety of applications, such as in an automobile or a computer system, where there is a need for bi-directional ESD protection.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An electrostatic discharge (ESD) device for protecting an input/output terminal of a circuit, the device comprising:
a first transistor with an integral silicon-controlled rectifier (SCR) coupled between the input/output (I/O) terminal of the circuit and a node;
a second transistor with an integral silicon-controlled rectifier coupled between the node and a negative terminal of a supply voltage, wherein the silicon-controlled rectifier of the first transistor triggers in response to a negative ESD voltage and the silicon-controlled rectifier of the second transistor triggers in response to a positive ESD voltage;
wherein the first transistor and the second transistor are configured as diode coupled transistors; and
a communication driver device is coupled between the node and the negative terminal of the supply voltage.

2. The device of claim 1, the communication driver device being a metal oxide semi-conductor field effect transistors (MOSFET).

3. The device of claim 1, the first transistor being configured as a diode coupled transistor and the second transistor being configured as a communication driver device.

4. The device of claim 1, the communication driver device being a low-side driver.

5. A communication driver device having electrostatic discharge (ESD) protection, the device comprising:
a resistor coupled between a positive terminal of a supply voltage and an input/output terminal and a node; and
a transistor with an integral silicon-controlled rectifier configured as a communication driver, the transistor being coupled between the node and a negative terminal of a supply voltage, wherein the silicon-controlled rectifier (SCR) of the transistor triggers in response to a positive ESD voltage.

6. The device of claim 5, further comprising a diode coupled transistor with an integral SCR coupled between the input/output terminal of the circuit and the node, wherein the silicon-controlled rectifier of the diode coupled transistor triggers in response to a negative ESD voltage.

7. The device of claim 6, the transistor configured as a communication driver and the diode coupled transistor being laterally diffused metal oxide semi-conductor field effect transistors (LDMOSFET) configured to include an integral SCR.

8. The device of claim 5, the transistor configured as a communication driver and the diode coupled transistor being n-type devices.

9. The device of claim 5, further comprising a buffer that receives a communication signal that is provided to a gate of the transistor configured as a communication driver during communication transmissions.

10. A communication system having electrostatic discharge (ESD) protection, the system comprising:
a resistor coupled between a positive terminal of a supply voltage and an input/output terminal of the circuit and a node;
a first laterally diffused metal oxide semi-conductor field effect transistor (LDMOSFET) with an integral rectifier (SCR) configured as a diode coupled transistor having an anode coupled to the input/output terminal of the circuit and a cathode coupled to the node; and
a second LDMOSFET with an integral SCR configured as a communication driver coupled between the node and a negative terminal of a supply voltage, the second LDMOSFET having a gate operative to receive a communication signal, wherein the SCR of the first LDMOSFET triggers in response to a negative ESD voltage and the SCR of the second transistor triggers in response to a positive ESD voltage.

11. The system of claim 10, wherein the first and second LDMOSFET are n-type devices.

12. The system of claim 10, further comprising a buffer that receives a communication signal that is provided to a gate of the second LDMOSFET.

13. The system of claim 10, wherein the current flows through at least one of a body diode of the first LDMOSFET and a body diode of the second LDMOSFET until the drain to source voltage of the second LDMOSFET is sufficiently high to trigger the integral SCR of the second LDMOSFET during a positive ESD event, and current flows through at least one of a body diode of the first LDMOSFET, a body diode of a second LDMOSFET, and a substrate diode of the first LDMOSFET until the drain to source voltage of the first LDMOSFET is sufficiently high to trigger the integral SCR of the first LDMOSFET during a negative ESD event.

14. The system of claim 10, wherein the system is a high voltage system that operates with a supply voltage of at least 40 volts.

15. The system of claim 10, wherein the integral SCR of the first LDMOSFET triggers at a voltage less than or equal to −50 volts.

16. The system of claim 10, wherein the integral SCR of the second LDMOSFET triggers at a voltage greater than or equal to 50 volts.

17. A communication system comprising:
a central processing unit (CPU) operative to provide a communication signal;
a communication driver circuit with integral, bi-directional electrostatic discharge (ESD) protection;
an I/O communication bus operative to transmit the communication signal; and
a receiver operative to process the transmitted signal.

18. The communication system of claim 17, wherein the communication driver circuit further comprises a first laterally diffused metal oxide semi-conductor field effect transistor (LDMOSFET) with an integrated silicon-controlled rectifier (SCR) configured as a diode coupled transistor having an anode coupled to an input/output terminal of the communication driver circuit and a cathode coupled to a node.

19. The communication system of claim 18, wherein the communication driver circuit further comprises a second LDMOSFET with an integrated SCR configured as a communication driver coupled between the node and a negative terminal of a supply voltage, the second LDMOSFET having a gate operative to receive a communication signal, wherein the SCR of the first LDMOSFET triggers in response to a negative ESD voltage and the SCR of the second transistor triggers in response to a positive ESD voltage.

* * * * *